(12) United States Patent
Labrousse et al.

(10) Patent No.: US 7,107,650 B2
(45) Date of Patent: Sep. 19, 2006

(54) EQUIPMENT WITH A PIVOTING HANDLE, IN PARTICULAR TO BE SUSPENDED IN AN AIRCRAFT CONSOLE

(75) Inventors: Gilles Labrousse, Bordeaux (FR); Alain Tantet, Pessac (FR)

(73) Assignee: Thales, Paris (FR)

( * ) Notice: Subject to any disclaimer, the term of this patent is extended or adjusted under 35 U.S.C. 154(b) by 0 days.

(21) Appl. No.: 10/943,954

(22) Filed: Sep. 20, 2004

(65) Prior Publication Data

US 2005/0039304 A1    Feb. 24, 2005

Related U.S. Application Data

(63) Continuation of application No. 10/275,739, filed as application No. PCT/FR01/01249 on Apr. 24, 2001, now Pat. No. 6,829,809.

(30) Foreign Application Priority Data

May 9, 2000    (FR)  ................................. 00 05862

(51) Int. Cl.
A45F 5/00    (2006.01)
(52) U.S. Cl. ........................................ 16/438
(58) Field of Classification Search ................ 16/405, 16/429, 438, 444
See application file for complete search history.

(56) References Cited

U.S. PATENT DOCUMENTS

| | | | |
|---|---|---|---|
| 2,931,205 A * | 4/1960 | Schmitz | ........................ 70/92 |
| 3,588,239 A | 6/1971 | Hochstein et al. | |
| 3,745,796 A * | 7/1973 | Fleming | ........................ 70/81 |
| 4,184,705 A * | 1/1980 | Little | ........................ 292/247 |
| 4,440,431 A | 4/1984 | Collurafici et al. | |
| 4,510,779 A | 4/1985 | Ahad | |
| 4,544,050 A | 10/1985 | Seynhaeve | |
| 4,991,818 A | 2/1991 | Darbo et al. | |
| 5,075,925 A | 12/1991 | Maloney | |
| 5,208,735 A | 5/1993 | Twachtmann et al. | |

FOREIGN PATENT DOCUMENTS

| | | |
|---|---|---|
| DE | 39 41 030 | 6/1990 |
| EP | 0 524 040 | 1/1993 |
| GB | 781 145 | 8/1957 |

\* cited by examiner

*Primary Examiner*—Gary S. Hartmann
(74) *Attorney, Agent, or Firm*—Oblon, Spivak, McClelland, Maier & Neustadt, P.C.

(57) ABSTRACT

An equipment with pivoting handles. The equipment includes a support and a pivoting handle that are assembled by at least one pivot pin, the pivoting handle being able to rest on at least one surface of the support. The handle includes at least one bearing surface and the equipment includes at least one pad of elastic material arranged to be compressed against the support by the bearing surface when the handle is resting on the surface of the support. The equipment may be applied for example to suspended equipment for aircraft consoles.

20 Claims, 3 Drawing Sheets

EQUIPMENT WITH A PIVOTING HANDLE, IN PARTICULAR TO BE SUSPENDED IN AN AIRCRAFT CONSOLE

CROSS-REFERENCE TO RELATED APPLICATIONS

This application is a continuation of U.S. application Ser. No. 10/275,739, filed Nov. 8, 2002, and is based upon and claims the benefit of priority from PCT Application No. PCT/FR01/01249, filed Apr. 24, 2001, and the prior French Patent Application No. 00 05862, filed May 9, 2000, the entire contents of each are incorporated herein by reference.

BACKGROUND OF THE INVENTION

The invention relates to an equipment with a pivoting handle, and in particular to a suspended equipment for an aircraft console. The equipment has to be able to be fitted into a system and removed from this system, for example to be updated or replaced. In the preferred case of an aircraft console, the equipment installed on the console is advantageously mounted locked suspended via its front face on the console and has a pivoting handle to make it easier to install.

Once the equipment has been installed in a system, the pivoting handle is folded back. When an operator wishes to extract this equipment from the system, particularly from a system with significant constraints on small size, he often finds the handle jammed, and extraction is then often performed with damage to the equipment and to any nearby equipment that might be present in the same system, by using tools of the lever type in order to access the handle. There are many reasons why the handle might jam, for example a tight space constraint forcing various equipments to be fitted into one and the same system in the most compact way possible, or alternatively misalignment leading to the handle jamming as it is installed in the system.

SUMMARY OF THE INVENTION

The invention proposes an equipment structured so that the handle is automatically rendered accessible when the equipment is to be extracted. For that, the handle is made accessible by automatic ejection, after unlocking, for example, of the equipment and of the associated pivoting handle, thus facilitating the actual extraction of the equipment. The means allowing this automatic ejection of the handle are simple and inexpensive to assemble and to manufacture.

According to the invention, there is provided an equipment comprising a support and a pivoting handle which are assembled by at least one pivot pin, the pivoting handle being able to rest on at least one surface of the support, characterized in that the handle comprises at least one bearing surface and in that the equipment comprises at least one pad of elastic material arranged in such a way as to be compressed against the support by the bearing surface when the handle is resting on the surface of the support.

BRIEF DESCRIPTION OF THE DRAWINGS

The invention will be better understood and other particulars and advantages will become apparent from the description hereinafter and from the appended drawings, given by way of examples, in which.

DETAILED DESCRIPTION OF THE PREFERRED EMBODIMENTS

The equipment according to the invention comprises a support. A pivoting handle is assembled with the support by at least one pivot pin. The pivoting handle may rest on at least one surface of the support when the handle is folded back, making the equipment as a whole more compact. The handle may in fact rest on all or part of one or several surfaces of the support. The handle comprises at least one bearing surface. The equipment comprises at least one pad of elastic material which is situated between the bearing surface and the support so that when the handle is folded back after the equipment has been installed, that is to say when the handle is resting on the surface of the support, the pad of elastic material is compressed between the bearing surface and the support. In all the remainder of the text, unless mentioned otherwise, pad and pad of elastic material will be used interchangeably. Thus, upon extraction, after unlocking, the compressed pad tends to revert to its initial, that is to say uncompressed, state, moving the bearing surface away from the support, that is to say moving these items away from one another, therefore ejecting the handle which was folded back onto the surface of the support and thus making it accessible to the operator who can then easily extract the equipment. The elasticity of the pad of elastic material is determined in such a way as to both allow the handle to be folded back during installation and allow the same handle to be ejected during extraction.

The equipment according to the invention is particularly advantageous in systems with a tight constraint on small size, because it allows both good compactness of the equipment when it is installed, and unjamming of the handle by ejection making extraction of the equipment easier and avoiding damage to this same equipment or to nearby equipment that might be present in the system. In the preferred case of a console for an aircraft, by allowing the equipment to be very compact with no significant protrusion on this same equipment the invention on the one hand makes it possible for the hand that the pilot slides over the console not to encounter any obstacles and, on the other hand, does not impair the pilot's view of the keys of the equipment suspended from the console, even the keys near the handle.

Figure 1:
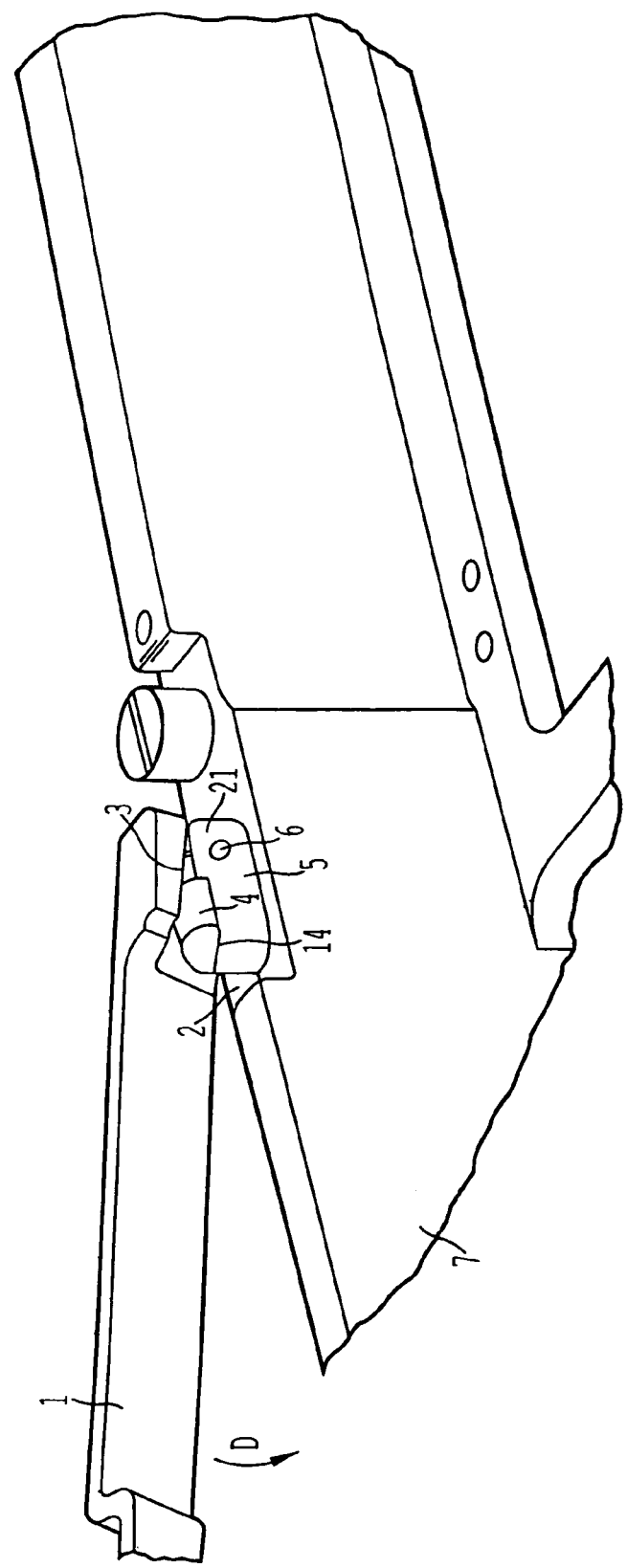
FIG. 1 schematically depicts an overall perspective view of a preferred embodiment of part of the equipment according to the invention.

FIG. 1 schematically depicts an overall perspective view of a preferred embodiment of part of the equipment according to the invention. A support 7 of the equipment comprises a surface 2 of the support 7 on which surface a handle 1 rests when the handle 1 is folded back against the equipment after the latter has been installed. The support 7 preferably comprises a boss 5 which bears a pivot pin 6. The handle 1 is associated with the support 7 via the pivot pin 6. The arrow D indicates the direction of rotation of the handle 1 when the handle 1 is folded back against the equipment, that is to say when the handle 1 is resting against the surface 2 of the support 7. The handle 1 comprises a bearing surface 3 which compresses a pad of elastic material 4 against the support 7, that is to say more specifically in this instance, against the boss 5. The boss 5 advantageously comprises a step 21, the pad of elastic material 4 being fixed at the foot of the step 21, that is to say on a surface 14, while the pivot pin 6 is included in the step 21. Upon extraction, the pad of elastic material 4 pushes the bearing surface 3 back and moves it away from the surface 14 on which the pad of elastic material 4 is fixed. The handle 1 is therefore ejected, that is to say pushed back from the surface 2 of the support 7 on which it was resting so as to be made accessible to any operator there might be, by rotation about the pivot pin 6 in the opposite direction to the arrow D. The handle 1 still remains secured to the support 7 by the pivot pin 6.

The pad of elastic material 4 is preferably fixed to the support 7, but may just as easily be fixed to the bearing surface 3 of the handle 1. The support 7 preferably comprises a boss 5 which comprises the pivot pin 6 and the pad of elastic material 4, but these items may be incorporated into the support 7 or even disappear into the support 7 so that the latter no longer has any protrusions.

The pad of elastic material 4 is preferably situated close enough to the pivot pin 6 to allow the handle 1 to be ejected when the handle 1 is resting on the surface 2 of the support 7 and when the handle 1 is unlocked, that is to say when the handle 1 is resting on the surface 2 of the support 7 while being in the unlocked state. The pad 4 is then ideally placed as close as possible to the pivot pin 6. The closer the pad of elastic material 4 is placed to the pivot pin 6, the lower the force needed to eject the handle 1 to an extent sufficient to make it accessible for extraction. The constraint regarding the elasticity of the pad of elastic material 4 is then relaxed.

The handle 1 comprises a passage hole through which the pivot pin 6 passes. The passage hole is advantageously oblong. The long dimension of the oblong hole is preferably parallel to the surface 2 of the support 7 when the handle 1 is resting on the surface 2 of the support 7. This long dimension in the case of FIG. 1 is also parallel to the bearing surface 3. Thus, the handle 1 can be folded down more easily upon installation and is also ejected more easily upon extraction. The risk of the handle 1 jamming in the system is thus reduced. In the preferred case of an aircraft console, the risk of jamming lies in particular at the console locking rail.

The handle 1 is preferably U-shaped, the branches of the U being connected to the central bar of the U by angles which are more or less right angles. The handle 1 is positioned around the center of the equipment when the handle 1 is folded back onto the surface 2 of the support 7. The equipment advantageously comprises a pad of elastic material 4 on each of the branches of the U, a pivot pin 6 being situated at each end of the U. The equipment is, for example, more or less rectangular. Throughout the remainder of the text, unless otherwise mentioned, the description will describe only that which occurs at one of the branches of the U, and so only the pad of elastic material 4 belonging to said branch of the U will be considered.

The bearing surface 3 is preferably more or less flat and more or less parallel to the pivot pin 6. Thus, the pad 4 compressed will be highly efficient at ejecting the handle 1 during extraction because the force exerted by the pad 4 as the pad 4 relaxes will be colinear with the movement of the handle 1 at the start of the ejection of the handle 1. The bearing surface 3, in the presence of a tight constraint on small bulk, will have a small size. The size of the pad of elastic material 4 may then, upon compression, extend and protrude beyond the bearing surface 3. Particular shear forces may then be exerted on certain types of pad of elastic material 4.

The pad 4 is advantageously more or less parallelepipedal, that is to say that it is composed of a parallelepipedal body which may contain cavities and on which protrusions may be housed. The pad 4, by comparison with other types of elastic components of the spring type, and for a given size, offers more effective ejection of the handle 1 upon extraction, in that the force that the pad 4 can supply as it relaxes is greater than the force that an elastic component of the spring type can supply.

Figure 2:
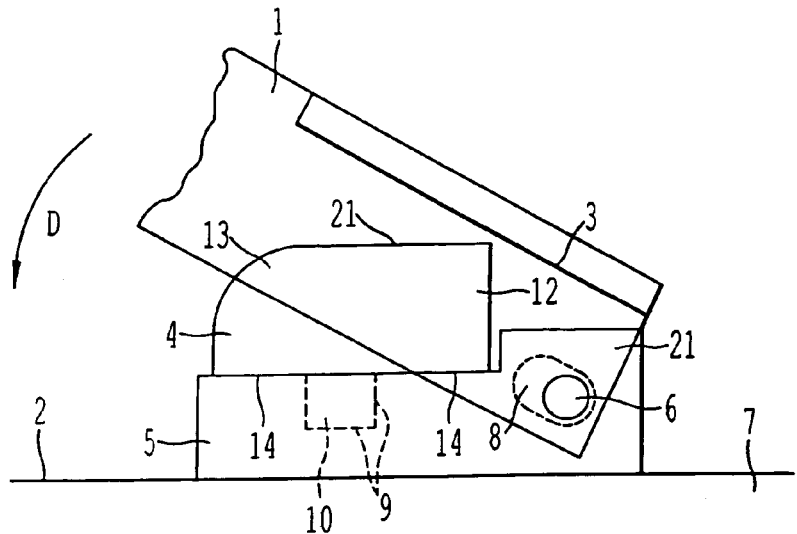
FIG. 2 schematically depicts a profile view of a detail of FIG. 1.

FIG. 2 schematically depicts a profile view of a detail of FIG. 1. The handle 1 comprises an oblong hole 8 through which the pivot pin 6 passes. The pad 4 has, on the parallelepipedal body of the pad 4, a protrusion 10 which is fixed by adhesive bonding into a counterbore 9 that the boss 5 has. A form other than cylindrical for the counterbore 9 may be anticipated. The pad 4 has a side 11 closest to the bearing surface 3 and in this region the pad 4 has a corner 13 furthest from the pivot pin and a corner 12 closest to the pivot pin. The furthest corner 13 is preferably rounded, which corresponds to a cavity on the parallelepipedal body of the pad 4. The parallelepipedal body of the pad 4 is advantageously fixed by adhesive bonding to the surface 14 of the boss 5.

As a preference, the boss 5 comprises a counterbore 9 in which a protrusion 10 of the pad 4 is housed, so as to reduce the risks of the pad 4 being driven out of the boss 5 when the handle 1 is folded back onto the surface 2 of the support 7. The relative secureness of the boss 5 of the support 7 and of the pad 4 is thereby enhanced.

The shape of the pad 4 is preferably structured so that on the side 11 of the pad 4 closest to the bearing surface 3 there is less material at the corner 13 furthest from the pivot pin 6 than there is at the corner 12 closest to the pivot pin 6. Thus, when the handle 1 is folded back onto the surface 2 of the support 7, the formation of a protruding lip is prevented, which lip could have been sheared off by the bearing surface 3 especially if the bearing surface 3 is, for small-size constraint reasons, of small size. Such a shape of pad 4 makes it possible at the same time to improve the force supplied by the relaxation of the pad 4 during ejection of the handle 1 and the deformation of the pad 4 as it compresses, when the handle 1 is folded back onto the surface 2 of the support 7. In a first preferred embodiment of the pad 4, the corner 13 furthest from the pivot pin 6 is rounded, as in FIG. 2. In a second preferred embodiment of the pad 4, the corner 13 furthest from the pivot pin 6 is chamfered, the rounded shape of the first embodiment being replaced by one or more inclined planes.

The pad 4 is made of elastic material. The elastic material is both soft enough to allow the pad 4 to be compressed when the handle 1 is folded back onto the surface 2 of the support 7 upon installation and hard enough to succeed in ejecting the handle 1 upon extraction in spite of the possibility that the handle 1 might be jammed in its folded-back position. For that, the elastic material preferably has a Shore hardness of about 60.

The elastic material also preferably has good reliability in a very aggressive environment. In the preferred case of an aircraft console, there are many types of attack to which the pad 4 may be subjected. These are, for example, chemical attacks, such as a beverage knocked over on the console by the pilot, or alternatively dust or sand insinuating into the console, or alternatively mold or fungi growing at the console. The elastic material is advantageously a silicone resin, for example of the RTV147 type. The pad 4 is advantageously fixed to the surface 14 of the boss 5 by adhesive bonding. The adhesive bonding preferably uses a silicone adhesive, for example of the RTV581 type.

The equipment preferably comprises catches for securing the equipment and the handle 1, so as to stabilize the relative position of the equipment and of the system once the equipment has been installed, keeping the handle 1 in the folded-back position in spite of the opposing force of relaxation of the pad of elastic material 4 which is then compressed.

Figure 3:
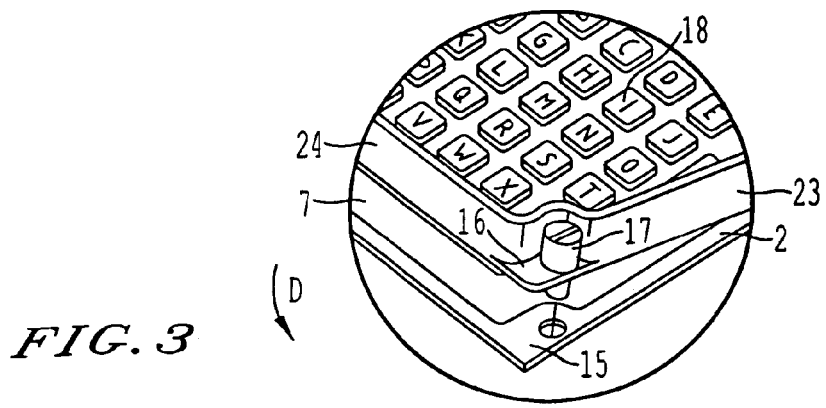
FIG. 3 schematically depicts a perspective view of a preferred embodiment of another part of the equipment according to the invention.

FIG. 3 schematically depicts a perspective view of a preferred embodiment of another part of the equipment according to the invention. The surface 2 of the support 7 is a setting-down plane 15 situated under the central part 18 of the equipment which here is depicted in the form of a keyboard with keys. The support 7 surrounds this central part 18 which is, for example, more or less rectangular. The handle 1 surrounds the support 7 when the handle 1 is folded back onto the surface 2 of the support 7, that is to say onto the setting-down plane 15, moving in the direction of the arrow D. One of the catches, the catch 17, is built into the handle 1, the catch 17 here being depicted in the form of a fastener. The catch 17 is advantageously situated where the branch and the central bar of the U of which the handle 1 is formed meet. The handle 1 comprises a support plane 16 parallel to the pivot pin 6.

As a preference, at least one catch 17 for securing the equipment is built into the handle 1 so as simultaneously to lock the handle 1 and the equipment, this preventing any vibration of the handle 1 when the equipment is installed in a system which is itself made to suffer vibration. In the preferred case of the console of an aircraft, the handle 1 therefore prevents the production of a rattling noise disagreeable to the pilot.

The catch 17 built into the handle 1 is advantageously borne by a support plane 16 parallel to the pivot pin 6. As a preference, the catch 17 is a fastener and the surface 2 of the support 7 is a setting-down plane 15 pierced in line with the axis of the fastener 17. Thus, the setting-down plane 15 is immobilized by being trapped between the support plane 16 and the structure of the system in which the equipment is installed, this structure being a locking rail 19 in FIG. 4.

The catch 17 built into the handle 1 is preferably situated far enough away from the pivot pin 6 to allow the handle 1 to be ejected when the handle 1 is resting on the surface 2 of the support 7 and when the handle 1 is unlocked. Ideally, the latch 17 is situated where the branch 23 and the central bar 24 of the U meet, as in FIG. 3. The further the catch 17 is away from the pivot pin 6 and therefore from the pad 4, which for its part is preferably situated close to the pivot pin 6, the lower the force that the pad of elastic material 4 has to supply in order to eject the handle 1, and therefore the more relaxed the constraint on the elasticity of the pad of elastic material 4.

Figure 4:
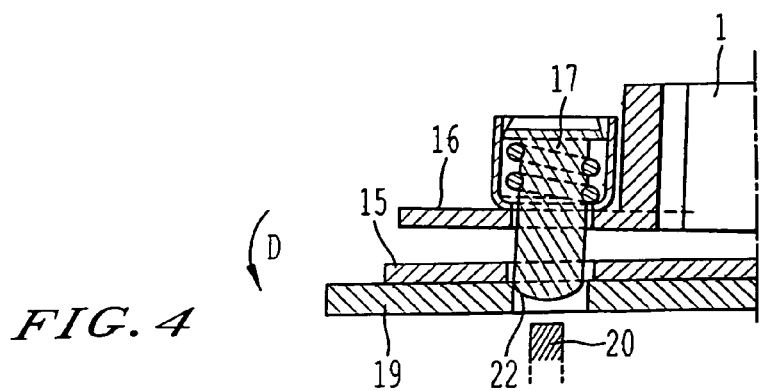
FIG. 4 schematically depicts a sectioned view of a detail of FIG. 3.

FIG. 4 schematically depicts a view in cross section of a detail of FIG. 3. The catch 17 here is advantageously a fastener of the DZUS type. When the handle 1 is folded back toward the setting-down plane 15 upon installation, the DZUS fastener 17 which comprises a central slot with a helical thread is screwed around a wire-like element 20. A locking rail 19 is secured to the structure of the system in which the equipment is installed; the rail 19 is, for example, secured to the structure of an aircraft console. Screwing the DZUS fastener 17 onto the wire-like element 20 simultaneously locks the handle 1 and the equipment via the support plane 16, the setting-down plane 15 and the locking rail 19. One of the forces that the relaxation force of the compressed pad of elastic material 4 may have to overcome is a remaining attachment at the region of attachment 22 between the DZUS fastener 17 and the locking rail 19.

Figure 5:
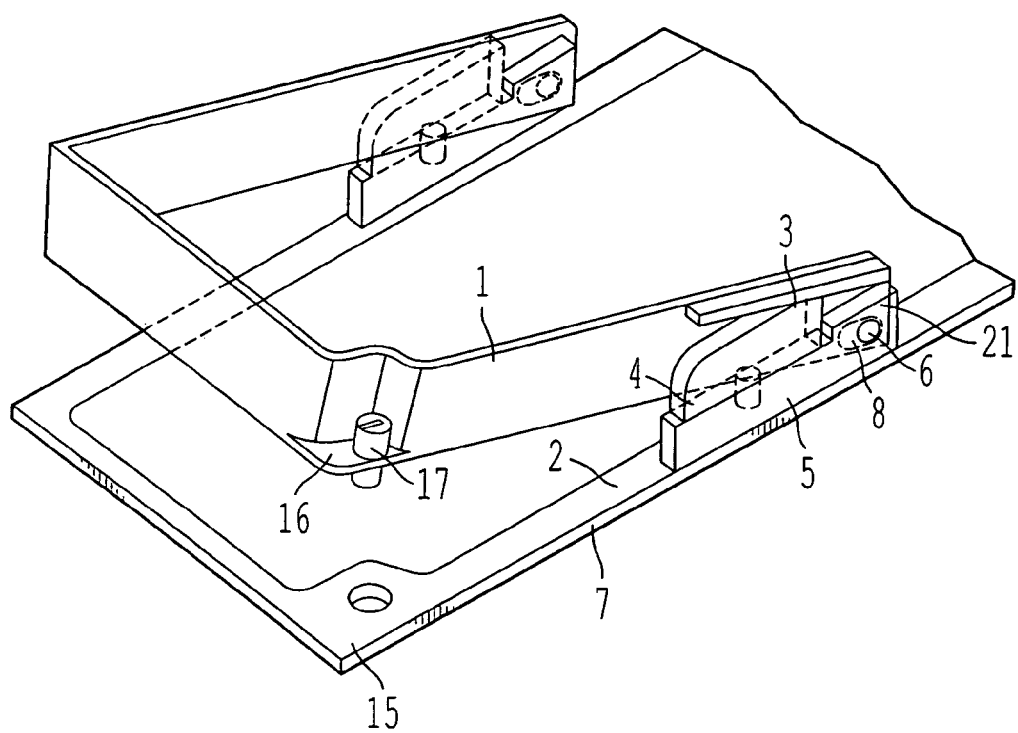
FIG. 5 schematically depicts an overall perspective view of an embodiment of the present invention.

FIG. 5 schematically depicts an overall perspective view of an embodiment of the present invention. The embodiment includes U-shaped handle 1, pivot pins 6, elastic pads 4 on each branch of the U of handle 1, and catch 17.

The invention is preferably applied to aircraft console suspended equipments, generally of rectangular shape, which are advantageously locked to the console by six fasteners which may be DZUS fasteners. Four fasteners may then be placed at the corners of the equipment, including the two fasteners incorporated into the handle 1. Two more fasteners may be placed in the middle of the long sides of the rectangular shape.

The invention claimed is:

1. An equipment for a console comprising:
   a support and a pivoting handle assembled by at least one pivot pin;
   at least one catch configured to secure the equipment and the pivoting handle to the console, the pivoting handle configured to rest on at least one surface of the support,
   wherein the handle includes at least one bearing surface and the equipment further comprises at least one pad of elastic material, said at least one pad configured to be compressed against the support by the bearing surface when the handle is resting on the surface of the support, the equipment being fixed to the console.

2. The equipment as claimed in claim 1, wherein the at least one pad is fixed to the support.

3. The equipment as claimed in claim 1, wherein the bearing surface is substantially flat and substantially parallel to the at least one pivot pin.

4. The equipment as claimed in claim 1, wherein the support comprises a boss that includes the at least one pivot pin and the at least one pad.

5. The equipment as claimed in claim 4, wherein the boss includes a counter bore in which a protrusion of the at least one pad is housed.

6. The equipment as claimed in claim 1, further comprising a passage hole in the handle through which the at least one pivot pin passes, the passage hole being oblong.

7. The equipment as claimed in claim 1, wherein the at least one pad is substantially parallelepipedal.

8. The equipment as claimed in claim 1, wherein the elastic material is a silicone resin.

9. The equipment as claimed in claim 1, wherein the elastic material has a Shore hardness of about 60.

10. The equipment as claimed in claim 1, wherein the at least one pad is fixed to the equipment by adhesive bonding.

11. The equipment as claimed in claim 1, wherein the corner furthest from the at least one pivot pin is rounded.

12. The equipment as claimed in claim 1, wherein the corner furthest from at least one the pivot pin is chamfered.

13. The equipment as claimed in claim 1, wherein the at least one pad is configured to eject the handle when the handle is resting on the surface of the support in the unlocked state.

14. The equipment as claimed in claim 1, wherein one of said at least one catch is built into the handle to simultaneously lock the handle and the equipment.

15. The equipment as claimed in claim 14, wherein the at least one catch is configured allow said at least one pad to eject the handle when the handle is resting on the surface of the support and when the handle is unlocked.

16. The equipment as claimed in claim 14, wherein the at least one catch built into the handle is borne by a support plane parallel to a pivot pin axis.

17. The equipment as claimed in claim 14, wherein the at least one catch built into the handle is a fastener and the surface of the support is a setting-down plate pierced in line with an axis of the fastener.

18. The equipment as claimed in claim 1, wherein the handle is U-shaped, branches of the U being connected to a central bar of the U by angles that are substantially right angles.

19. The equipment as claimed in claim 18, wherein the equipment further comprises a pad of elastic material on each of the branches of the U, a pivot pin being situated at each end of the U.

20. The equipment as claimed in claim 1, wherein the equipment is an aircraft console suspended equipment.

* * * * *

UNITED STATES PATENT AND TRADEMARK OFFICE
CERTIFICATE OF CORRECTION

| | | |
|---|---|---|
| PATENT NO. | : 7,107,650 B2 | Page 1 of 1 |
| APPLICATION NO. | : 10/943954 | |
| DATED | : September 19, 2006 | |
| INVENTOR(S) | : Labrousse et al. | |

It is certified that error appears in the above-identified patent and that said Letters Patent is hereby corrected as shown below:

On the title page, Item (45), the Terminal Disclaimer has been omitted. Item (45) should read:

-- (45) Date of Patent:      * Sep. 19, 2006

(*) Notice: Subject to any disclaimer, the term of this patent is extended or adjusted under 35 U.S.C. 154 (b) by 0 days.

This patent is subject to a terminal disclaimer.--

Signed and Sealed this

Twelfth Day of December, 2006

JON W. DUDAS
*Director of the United States Patent and Trademark Office*